United States Patent [19]
Waarts et al.

[11] Patent Number: 5,790,576
[45] Date of Patent: Aug. 4, 1998

[54] HIGH BRIGHTNESS LASER DIODE SOURCE

[75] Inventors: Robert G. Waarts, Fremont; Robert J. Lang, Pleasanton; Julian S. Osinski, Palo Alto; Edmund L. Wolak, Mountain View; John Endriz, Belmont, all of Calif.

[73] Assignee: SDL, Inc., San Jose, Calif.

[21] Appl. No.: 669,099

[22] Filed: Jun. 26, 1996

[51] Int. Cl.⁶ .................. H01S 3/18; G02B 3/02; G02B 3/06; G02B 3/08
[52] U.S. Cl. .............. 372/43; 372/108; 359/719; 359/711; 359/741
[58] Field of Search .................. 372/45, 43, 46, 372/50, 101, 108; 359/719, 708, 711, 741

[56] References Cited

U.S. PATENT DOCUMENTS

| | | | |
|---|---|---|---|
| 4,312,573 | 1/1982 | Sternberg | 350/432 |
| 5,027,359 | 6/1991 | Leger et al. | 372/101 |
| 5,081,639 | 1/1992 | Snyder et al. | 372/101 |
| 5,216,687 | 6/1993 | Fujino et al. | 372/70 |
| 5,223,978 | 6/1993 | Burkhart et al. | 359/719 |
| 5,229,883 | 7/1993 | Jackson et al. | 359/569 |
| 5,293,269 | 3/1994 | Burkhart et al. | 359/719 |
| 5,299,222 | 3/1994 | Shannon et al. | 372/75 |
| 5,321,718 | 6/1994 | Waarts et al. | 372/108 |
| 5,333,017 | 7/1994 | Volk | 351/205 |
| 5,337,328 | 8/1994 | Lang et al. | 372/45 |
| 5,369,659 | 11/1994 | Furumoto et al. | 372/101 |
| 5,369,661 | 11/1994 | Yamaguchi et al. | 372/69 |
| 5,410,563 | 4/1995 | Nakamura et al. | 372/108 |
| 5,467,335 | 11/1995 | Braat | 359/711 |
| 5,521,999 | 5/1996 | Chuang et al. | 385/88 |

FOREIGN PATENT DOCUMENTS 0286368  10/1988  European Pat. Off. .

*Primary Examiner*—Rodney B. Bovernick
*Assistant Examiner*—Quyen Phen Leung
*Attorney, Agent, or Firm*—W. Douglas Carothers, Jr.

[57] ABSTRACT

Coherent light sources combining a semiconductor optical source with a light diverging region, such as a flared resonator type laser diode or flared amplifier type MOPA, with a single lens adapted to correct the astigmatism of the light beam emitted from the source is disclosed. The lens has an acircular cylindrical or toroidal first surface and an aspheric or binary diffractive second surface. The first surface has a curvature chosen to substantially equalize the lateral and transverse divergences of the astigmatic beam. Sources with an array of light diverging regions producing an array of astigmatic beams and a single astigmatism-correcting lens array aligned with the beams are also disclosed. The single beam source can be used in systems with frequency converting nonlinear optics. The array source can be stacked with other arrays to produce very high output powers with high brightness.

33 Claims, 6 Drawing Sheets

HIGH BRIGHTNESS LASER DIODE SOURCE

TECHNICAL FIELD

The present invention relates to optical systems forming a coherent light source of high power and brightness, and in particular to such sources that include a high brightness, semiconductor laser diode, such as a single-spatial-mode broad-area laser diode, a flared-resonator-type (unstable resonator) laser diode or a MOPA device, in combination with astigmatism-correcting optics for that source.

BACKGROUND OF THE INVENTION

U.S. Pat. No. 5,321,718, Waarts et al. describe a coherent light source having an astigmatism-correcting lens system positioned in the path of a high power, but astigmatic, coherent light beam from a semiconductor optical source such as a flared-amplifier-type MOPA device or a flared-resonator-type laser diode. A number of lens configurations are described, which include combinations of cylindrical and spherical lens surfaces. While most of the embodiments use from two to four lenses, one embodiment employs a single lens with two crossed positive cylinder lens surfaces. Another embodiment uses a lens having a positive toric surface and a planar surface. All of the lens systems are adapted to provide a modified astigmatism-free light beam from the astigmatic light received from the semiconductor optical source. The astigmatism-free light is useful for many laser applications, including frequency conversion, of which a number of configurations are disclosed.

In U.S. Pat. No. 5,369,661, Yamaguchi et al. disclose an optical system for coupling light from a semiconductor laser array into a solid-state laser medium or into an optical fiber. The optics include a gradient index (GRIN) lens array to condense the individual light beams emitted with a large divergence angle from the semiconductor laser array to form parallel collimated light beams. A separate aspherical lens then converges the light beams into a single beam spot. Stacks of two or more laser arrays with corresponding stacks of two or more GRIN lens arrays are also disclosed, which form a 2-D array of parallel light beams. An aspherical lens then condenses the array of light beams to a beam spot for coupling to a fiber. Plural sets of stacked arrays may be combined by arranging their respective optical fibers to form a fiber bundle.

U.S. Pat. Nos. 5,229,883 to Jackson et al., 5,081,639 to Snyder et al., and 5,293,269 to Burkhart et al. disclose lens optics for collimating the diverging light output from diode lasers and diode laser arrays. Jackson et al. use a first cylindrical lens for collimating the light in the fast axis (or transverse direction) and a second binary diffractive optical element or array of such elements, simulating one or more aspheric lens surfaces, for collimating the light in the slow axis (or lateral direction). Snyder et al. use a cylindrical lens having an elliptical or hyperbolic cross-section, while Burkhart et al. use a lens with a circular-cylindrical back surface and an acircular-cylindrical front surface. Both of these cylindrical lenses are formed by means of a fiber lens drawing process from a master or preform having the desired cross-section.

In U.S. Pat. No. 5,216,687, Fujino et al. employ a spherical first lens or a GRIN lens array for collimating the light from a semiconductor laser or laser array in the fast axis, and a bicylindrical second lens with crossed (orthogonally oriented) cylindrical surfaces for focusing the light in both its fast and slow axes to a spot.

In providing lens optics for semiconductor laser sources that emit highly astigmatic light beams, such as flared-resonator-type laser diodes or flared-amplifier-type MOPAs, it is desirable that the optics not only correct for the astigmatism in the light, but also be compact, have a minimum number of refracting surfaces within the constraints of manufacturability, be easily positioned in front of the laser source at the proper locations within the design tolerances, and preferably be inexpensive to make. A minimum loss of brightness is preferred, so that numerical aperture is an important design parameter. Likewise, when arrays of such astigmatic laser sources are used, the corresponding lens arrays need to provide a precise center-to-center spacing between lenslets and be designed, if possible, for maximum beam filling of the emitted array of light beams. Unfortunately, many of these requirements conflict so that trade-offs must be made. A theoretical design calculated from purely optical considerations may include lens surfaces which are difficult and very expensive to manufacture. If the design is limited to easily manufactured lenses with circular-cylindrical and spherical lens surfaces, multiple lenses are required, which must be precisely positioned, and which generally limit the numerical aperture and beam filling factor that are achievable, thus reducing brightness.

An object of the invention is to provide a coherent light source in which the astigmatism-correcting lens optics for high power semiconductor laser sources that emit astigmatic light beams preserve the brightness of the emitted light, while being compact, inexpensively manufacturable and easily positioned for astigmatism-correction and beam collimation.

Another object of the invention is to provide an astigmatism-correcting lens array for a diode laser array that is inexpensive to manufacture with maximum beam filling and brightness conservation of the array of emitted beams.

SUMMARY OF THE INVENTION

The objects of the invention are met with a coherent light source comprising a semiconductor optical source generating and emitting a high power coherent light beam that is astigmatic, and a single astigmatism-correcting lens positioned in the path of the light beam, where this single lens has a first acircular-cylindrical or toroidal lens surface and a second aspheric or binary diffractive lens surface. The objects are also met with a coherent light source comprising a semiconductor optical source generating and emitting an array of high power coherent light beams, each of which is astigmatic, and a single astigmatism-correcting lens array positioned in the paths of the light beams, such that each lenslet is aligned with a corresponding laser light emitter of the source, and where a first surface of the lens array is either an acircular cylinder extending across the width of the array or an array of toroidal lens surfaces aligned with the light beams. The second lens array surface is an array of either aspheric or binary lens elements.

The toroidal surfaces of these lenses or lens arrays can be made easily and inexpensively with a mold, in which either the mold itself or a master for the mold is machined using a technique that involves cutting with a diamond-tipped cutting tool into the circumferential surface of a cylindrical blank mounted on a rotating spindle. The depth of the cut varies axially to create a toroidal surface or an array of toroidal surfaces whose axial cross-section can be acircular. The section cut perpendicular to the master's rotation axis is necessarily circular. When the mold itself is machined in this way, the toroidal surface formed by the diamond turning technique is a negative of the resulting toroidal lens surface. When the machined surface is used as a master to create the mold, the original toroidal surface of the master can be a positive of the final lens surface created by the mold.

The semiconductor optical source that is combined with the single astigmatism-correcting lens may be included in an optical cavity having a gain region with a lateral dimension along its length in the cavity that is greater than a lateral dimension of the light path along other portions of the optical cavity. For example, it can be a flared-amplifier-type MOPA device, a flared-resonator-type (unstable resonator) laser diode, or some other laser diode with a light diverging region therein. Alternatively, it may be a wide-area laser diode with an angled DFB grating or any other spatially coherent source with strong astigmatism.

The coherent light sources with their astigmatism-corrected laser-diode-based emission can be used in a number of applications requiring high power astigmatism-free beams. For example, the source can be coupled to a frequency-converting nonlinear optical medium. Alternatively, multiple laser source/correction lens systems can be stacked to form a 2-D array, then coupled by focusing optics into an optical fiber to create a very high power source. Such a light source can be employed, for example, in a system for material processing, such as material cutting, welding or surface treatment with the light beam. Other applications for these sources are also possible.

DETAILED DESCRIPTION OF THE PREFERRED EMBODIMENTS OF THE INVENTION

Figure 1:
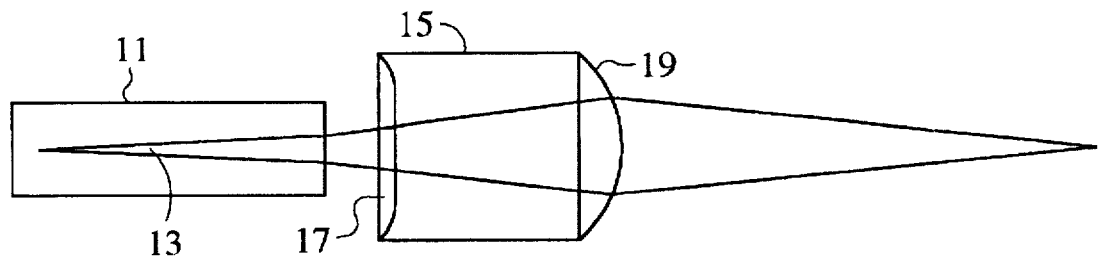
FIGS. 1 and 2 are respective lateral and transverse sections taken through the optical axis of a coherent light source of the present invention with a cylindrical-aspherical lens.
Figure 2:
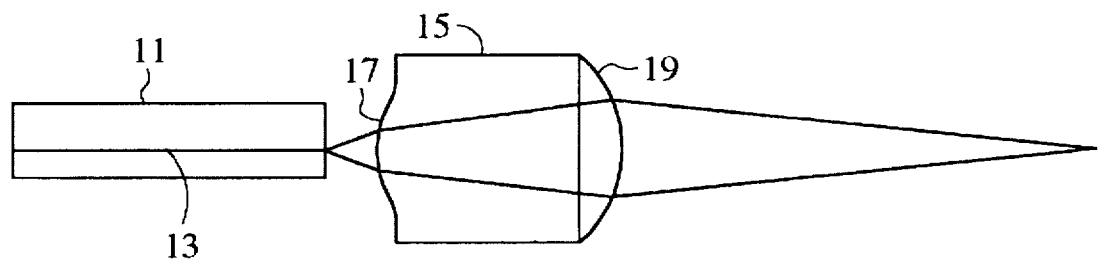

With reference to FIGS. 1 and 2, a coherent light source embodying the present invention includes (1) a semiconductor optical source 11 which emits a spatially coherent light beam of high power that is also both highly asymmetric and astigmatic, and (2) a single lens 15 with a first lens surface 17 having an acircular cross-section and a second lens surface 19, which have curvatures that in combination are adapted to correct the astigmatism in the light beam, and which thereby provides a modified astigmatism-free light beam.

The semiconductor optical source 11 may comprise a laser diode with a light diverging region 13 therein. Such a laser diode can be, for example, a flared-amplifier-type MOPA device or a flared-resonator-type laser diode (also known as an unstable-resonator (UR) device). In the UR device, the entire gain region including a flared portion lies within the laser cavity, whereas in the MOPA device, at least a portion of a flared gain region lies outside of the laser cavity to form an optical power amplifier that is optically coupled to a laser oscillator section within the laser cavity. Yet another semiconductor optical source 11 which could be used may be a wide-area laser diode with a broad gain region and a distributed feedback (DFB) grating oriented at an angle to the emitting surface, as taught in U.S. Pat. No. 5,337,328.

Figure 3:
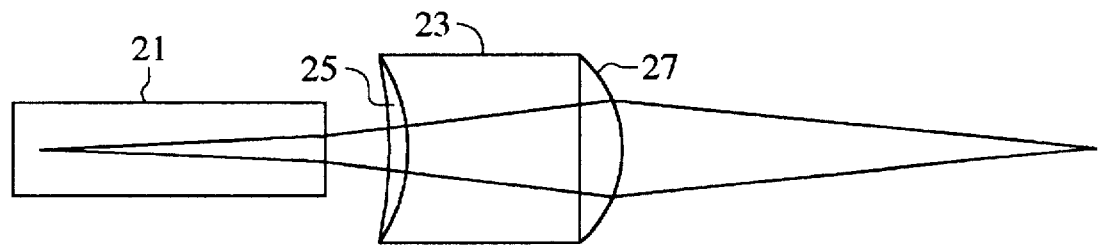
FIGS. 3 and 4 are respective lateral and transverse sections taken through the optical axis of a coherent light source of the present invention with a toroidal-aspherical lens.
Figure 4:
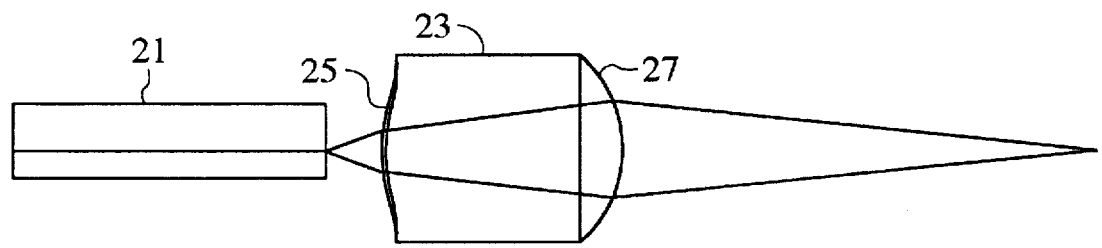

All of these semiconductor optical sources 11 produce output laser beams that are both highly asymmetric and astigmatic. In the case of the UR and flared-amplifier MOPA devices, and other similar laser diodes with light diverging regions therein, the light propagating in the flared portion of the device 11 is guided in the transverse direction (defined as perpendicular to the plane of the active gain region 13) as far as the output facet of the device, but is allowed to diverge in the lateral direction (defined as parallel to the plane of the active region, and perpendicular to the light propagation direction). One consequence of this lateral divergence with transverse guiding is that the lateral beam dimension is at least 10 times and typically several hundred times larger than the transverse beam dimension at the emitting surface. The lateral and transverse divergence angles will usually differ as well, with a typical effective transverse divergence of about 0.35 N.A. (i.e., about ±20°) and a lateral divergence of about 0.16 N.A. (i.e., about ±9°). Moreover, the apparent locations of the lateral and transverse beam waists of the output light do not coincide. The transverse beam waist is located at or very near to the output facet where transverse guiding ends. The lateral beam waist is located at the narrow end of the flared region, where it is coupled to a single mode waveguide, for example, and where lateral guiding ends and lateral divergence begins. And although this lateral beam waist is reimaged closer to the output surface when the light is refracted as it exits the device, its apparent reimaged location is still a significant distance (usually at least 500 μm) behind the transverse beam waist location. In the case of the wide-area angled-DFB laser diodes (also referred to as α-DFB devices), there is also substantial asymmetry due to the broad gain region and very strong astigmatism since the output beam is nearly collimated in the lateral direction but diverges very fast in the transverse direction. In all of these cases, the astigmatism in the emitted light beam can make such sources unusable for many laser applications obtaining an astigmatism-free light beam is critical for most applications. The single lens element 15 in FIGS. 1 and 2, or the lens 23 in FIGS. 3 and 4, can be used to correct for the astigmatism.

In the particular embodiment shown in FIG. 1, the single lens 15 has a convex cylindrical first lens surface 17 of acircular cross-section and a radially symmetric, convex aspheric second lens surface 19. Assuming, for example, a typical semiconductor optical source 11 with an effective transverse divergence of 0.35 NA, a lateral divergence of 0.16 NA, and an astigmatism of 680 μm of the light beam emitted from its output surface, the light beam can be aberration-corrected and focused to a round diffraction-limited spot with a divergence of 0.10 NA by a single lens 15 with the following parameters. The first lens surface 17 is positioned 475 μm from the output surface of the source 11, and has an acircular cylindrical surface curvature defined by a radius of curvature of 480 μm, a conic constant of −4.465, and higher order correction terms. The thickness of the lens 15 is 2000 μm. The second lens surface 19 is a rotationally symmetric asphere with a radius of curvature of −864 pm (i.e., a convex surface), a conic constant of −1.182, and higher order correction terms. The modified astigmatism-free beam is brought to a 0.10 NA, 6 μm diameter focal spot located at a distance of 3660 μm from the second lens surface 19.

As seen in the cylindrical-asphere embodiment of FIGS. 1 and 2, the best results for the astigmatism-correcting lens 15 are obtained when the convex cylindrical first lens surface 17 has an acircular (in particular, hyperbolic) cross-section. However, while these lens could be manufactured in quantity by glass molding, it is difficult to produce a mold with a concave acircular cylindrical surface. Accordingly, a preferred embodiment, seen in FIGS. 3 and 4, uses a single lens 23 with a toroidal first lens surface 25, instead of the cylindrical lens 15. The second lens surface 27 is a radially symmetric convex asphere, as before. Assuming, for example, a typical semiconductor optical source 21 with the same output beam characteristics as that from the source 11 in FIGS. 1 and 2, the beam can be aberration-corrected and focused to a round diffraction-limited 0.10 N.A., 6 μm diameter spot by single lens 23 with the following parameters. The toroidal first lens surface 25 is positioned 480 μm from the output surface of the source 21, and has a toroidal surface curvature defined by a radius of curvature in the lateral direction of −5.0 mm (i.e., concave) with a lateral conic constant of zero (i.e., circular lateral cross-section), a radius of curvature in the transverse direction of 536 μm (i.e., convex), a transverse conic constant of −6.980, and higher order correction terms. The thickness of the lens 23 is again 2000 μm, and the second surface 27 is a convex rotationally symmetric asphere with a radius of curvature of −858 μm, a conic constant of −0.941, and high order correction terms. The focal spot is located at a distance of 3920 μm from the second lens surface 27.

Both embodiments in FIGS. 1–4 are useful for coupling light into a 0.2 N.A., 20 μm core optical fiber. Such a fiber could also be a double-clad fiber with a single-mode core, an inner cladding region surrounding the core, and an outer cladding surrounding the inner cladding. In such fiber coupling applications, the aberration correction and beam symmetrizing provided by the single lens 15 or 23 allows maximum optical power and brightness conservation when the light is coupled into the fiber located at or very near to the beam's focal spot. The fibers can be rare-earth-doped optical fiber amplifiers or lasers, if desired. The focused light beam might also be coupled through other single-mode apertures, such as into a frequency doubling waveguide. Instead of focusing the light beam to a spot, the beam could be collimated. The coherent light source of the present invention may be located completely within a laser cavity, including the single lens, as for example in a resonant doubling configuration, like those described in U.S. Pat. No. 5,321,718. Many other applications for the high brightness, high power astigmatism-free coherent light are possible.

Figure 5:
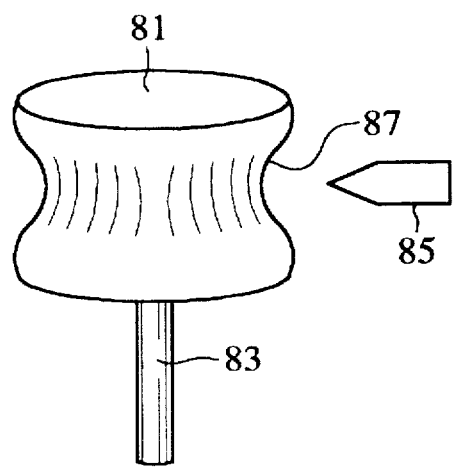
FIGS. 5 and 6 are perspective views illustrating cutting of a master or mold for a toroidal lens surface and a toroidal lens array surface respectively.

The toroidal-aspheric lenses of the present invention may be made by glass molding processes using a mold that has been cut with a diamond-tipped cutting tool as shown in FIG. 5. The mold begins as a cylinder blank 81 mounted axially on a spindle 83. As the spindle 83 rotates the blank 81, a diamond tool 85 cuts into the cylindrical surface 87 to create a negative of the desired lens profile. The radius of the body 81 determines the radius of curvature in the rotation direction, while the cutting depth at the various positions of the tool 85 along the body's rotation axis on the spindle 81 determines the profile in the axial direction. It can, therefore, be seen that the surface profile is necessarily toroidal and that the cross-section of the surface taken perpendicular to the rotation axis necessarily has a circular contour. The precise desired acircular shape to be formed in the axial direction can be computed using available lens design software. Aspheric molds can also be formed using this diamond turning technique, but with the cutting tool 85 positioned to remove material with a radially symmetric depth profile from the planar top surface of the cylindrical blank 81.

Figure 6:
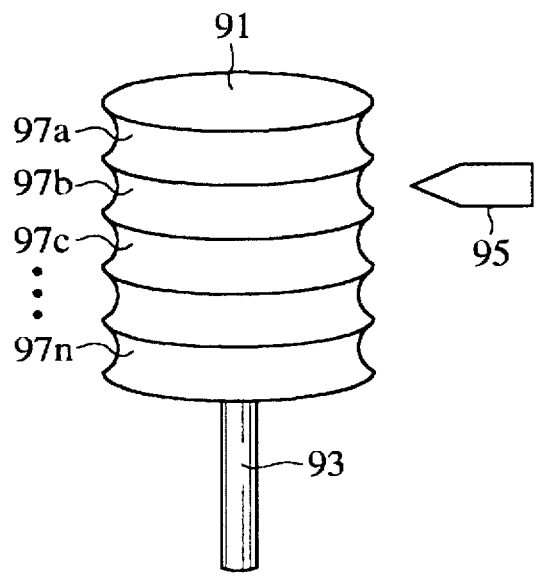
Figure 7:
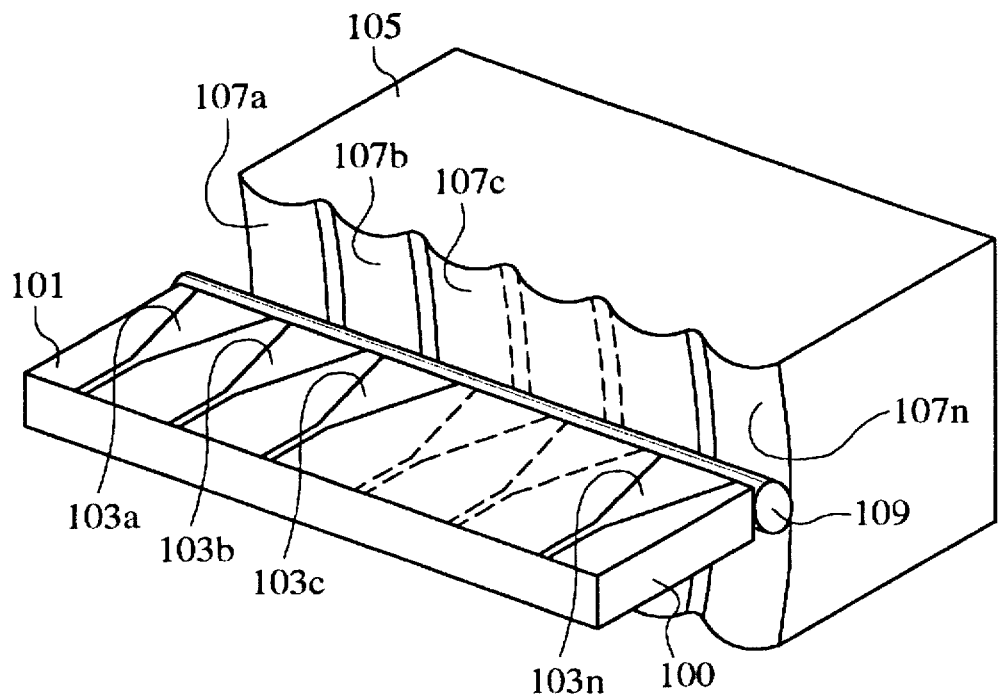
FIG. 7 is a perspective view of a coherent light source of the present invention including a semi-conductor laser array and a lens array with a toroidal lens array surface formed with the mold in FIG. 6.

Referring to FIG. 6, the same technique can also be used to create a precise mold for monolithic lens arrays. A cylindrical blank 91 is mounted axially on a spindle 93 and then rotated as a diamond-tipped cutting tool 95 cuts into the cylindrical surface of the blank 91 to create the mold for the lens array's toroidal surfaces. The tool 95 produces a plurality of identical, adjacent toroidal surface profiles 97a, 97b, 97c, . . . , 97n arranged axially along the originally cylindrical surface of the mold 91. The resulting lens 105, seen in FIG. 7, has an array of toroidal lens surfaces 107a, 107b, 107c, . . . , 107n which can be disposed in front of a monolithic laser diode array or "laser bar" 101 having a plurality of adjacent gain regions 103a, 103b, 103c, . . . 103n. The gain regions may include flared or other light diverging sections that result in astigmatic light outputs. A separate cylindrical fiber lens 109 may be used to collimate the fast diverging light in the transverse direction prior to the light encountering the individual toroidal lens surfaces 107a–107n of the lens 105. The diamond turning technique allows lens arrays to be constructed with very precise center-to-center spacing and with high quality precision acircular cross-sections in the transverse direction of each lenslet's surface profile. In addition to cutting concave profiles in the blank 91 seen in FIG. 6, convex profiles could also be cut for a positive master of the lens array. A negative mold would then be formed from the diamond-cut master, so that lens arrays with positive curvatures in both transverse and lateral directions can be manufactured.

Figure 8:
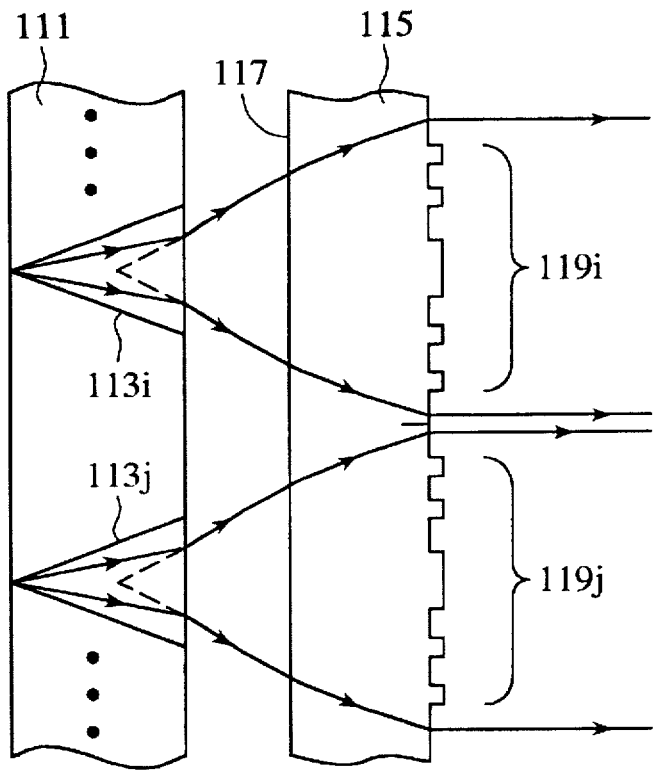
FIG. 8 is a top plan view of a coherent light source of the present invention including a cylindrical-binary lens array.
Figure 9:
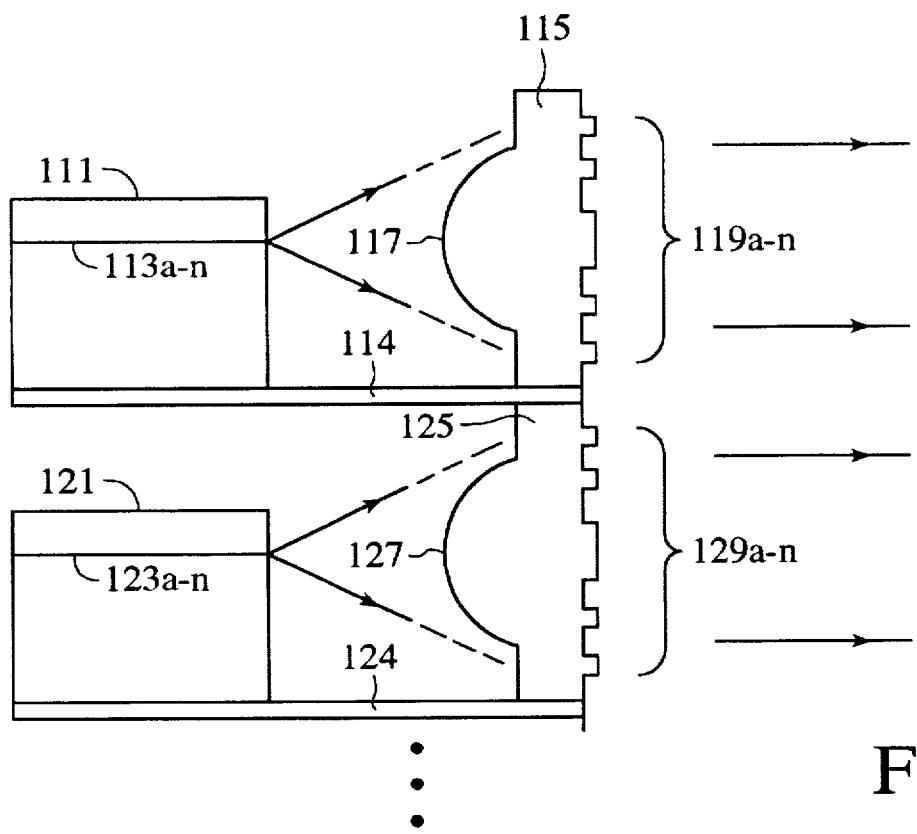
FIG. 9 is a side view showing the coherent light source of FIG. 8 stacked upon another like light source.

With reference to FIGS. 8 and 9, a laser diode array 111 having a plurality of laser emitters 113a, . . . , 113i, 113j, . . . , 113n optically coupled to a lens array 115. Both the laser bar 111 and the lens array 115 may be mounted on a common base 114 to maintain alignment of the corresponding laser emitters 113 and lens array elements 119. The laser emitters 113a–n may have a flared other light diverging section, as seen for the emitters 113i and 113j in FIG. 8, such that the light outputs are astigmatic. The lens array 115 has a first surface 117 which is cylindrical in shape to reduce the transverse divergence of the emitted light beams to substantially that of the lateral divergence. The lens array 115 also has a second surface having a plurality of binary diffraction lens elements 119a, . . . , 119i, 119j, . . . , 119n. Such binary lenslets could be formed by photolithographic etching. Alternatively, molded aspheric lenslets, like the lens surfaces 19 and 27 in FIGS. 1–4, could be used in place of the binary lens elements. In either case, the lens elements 119a–n collimate the light beams received from the laser emitters 113a–n. Preferably, the beams are also symmetrized at the same time their astigmatism is corrected, and the beams are allowed to expand to achieve a full (100%) fill factor. Accordingly, the first cylindrical lens surface 117 is positioned where the lateral and transverse size dimensions of the beam are substantially equal, and the lens array 115 has a thickness such that the lens elements 119a–n are positioned where the adjacent beams substantially meet. Beam aspect ratios other than 1:1 are also possible with an appropriate positioning of the first surface 117.

Figure 10:
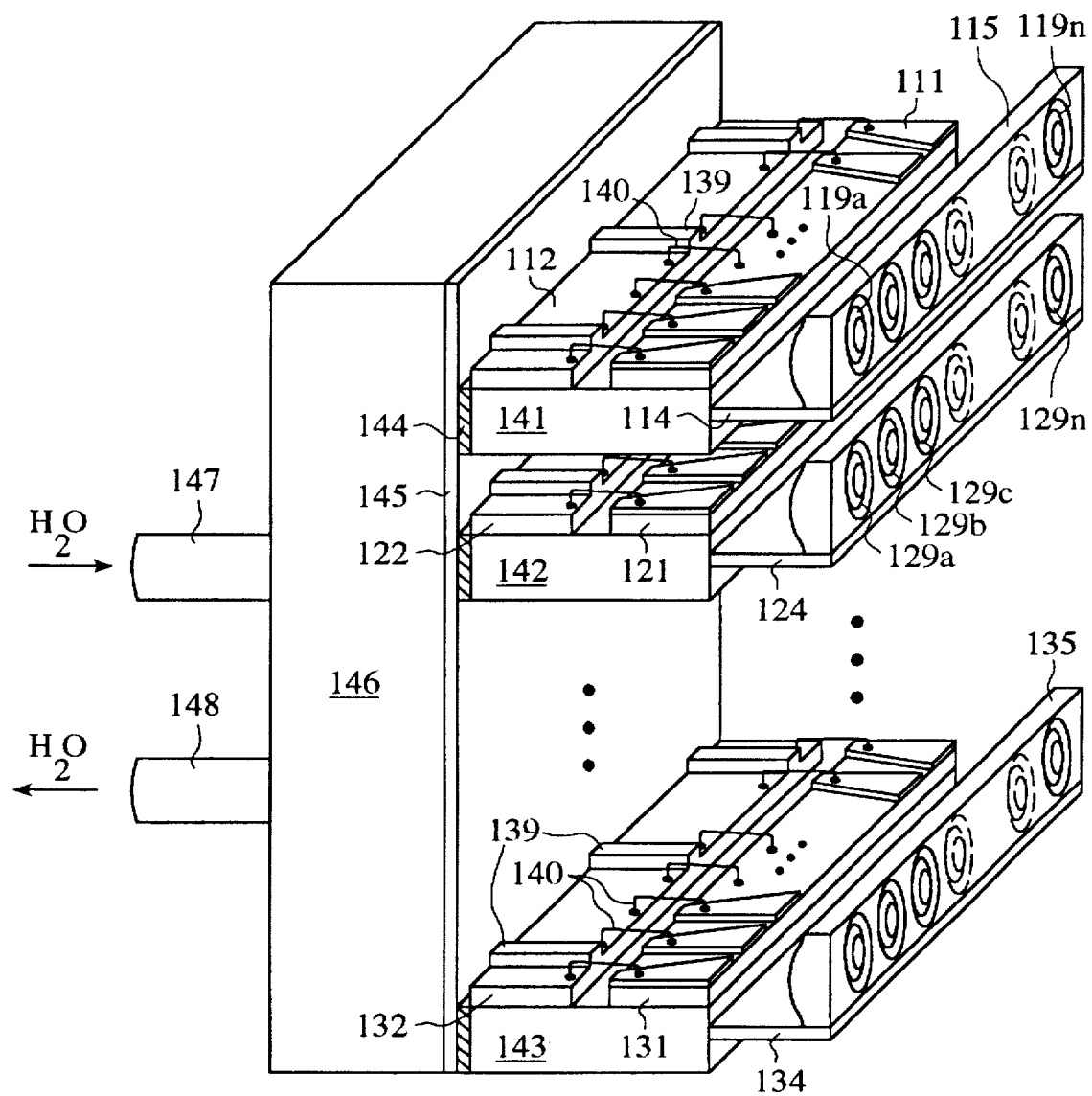
FIG. 10 is a perspective view of a stacked laser system with a plurality of coherent light sources like those illustrated in FIGS. 8 and 9.

As seen in FIGS. 9 and 10, laser arrays 111, 121, 131, etc. together with their corresponding lens arrays 115, 125, 135, etc. can be stacked one above the other to create an (m×n) matrix of collimated laser beams. Preferably, the stack forms a matrix with a 1:1 aspect ratio. For example, a stack of ten laser bars (m=10), each having ten laser emitting elements (n=10), could be formed, where the light from each emitter 113a–n, 123a–n, etc. is corrected for astigmatism and symmetrized to a 1:1 lateral-to-transverse beam width ratio by the lens elements 119a–n, 129a–n, etc. of the corresponding stack of lens arrays 115, 125, 135, etc. Alternatively, if the light beam from individual beam elements after astigmatism correction and collimation have a different lateral-to-transverse size ratio than 1:1, then the number of emitters (n) in a laser bar and the number of laser bars (m) in the stack can be chosen so that the stack has a different numerical aspect ratio (m:n) than 1:1, such that the overall light output from all of the matrix elements combined has a dimensional aspect ratio of 1:1. As yet another alternative embodiment, the combined light output from the stack need not have a symmetric dimensional ratio of 1:1, but could have any desired degree of asymmetry, if desired.

The stack may be constructed in a manner similar to that described in U.S. Pat. No. 4,716,568 and 5,099,488, or according to any other well-known technique used to construct commercially available stacked laser arrays. As shown in FIG. 10, for example, the laser bars 111, 121, 131, etc. may be mounted on plates or blocks 141, 142, 143, etc. of thermally conductive material. The material may be electrically insulative with an electrically conductive surface layer thereon or can be electrically conductive, such as copper. Typically, the bars 111, 121, 131, etc. are mounted p-side down on the plates for efficient heat sinking of the heat generating laser elements. The bases 114, 124, 134, etc. for the lens arrays 115, 125, 135, etc. may be monolithic extensions of the plates 141, 142, 143, etc. for the laser bars 111, 121, 131, etc., or may be bonded to the front ends of the plates 141, 142, 143, etc., so that the lens arrays 115, 125, 135, etc. are aligned with their respective laser bars 111, 121, 131, etc. Physical separation bars 112, 122, 132, etc. with a set of spaced apart ribs 139 are also mounted on each plate 141, 142, 143, etc. These separation bars or standoffs 112, 122, 132, etc. have a thickness which is approximately that of the laser bars 111, 121, 132, etc., so that the ribs 139 extend above the elevation of each laser bar's top surface such that the laser bars are spaced slightly from the plate 141, 142, etc. above it. The separation bars 112, 122, 132, etc. are made of electrically insulative material, such as BeO, to isolate their electrically conductive top surface contact layer from the conductive plate 141, 142, 143, etc. on which the bars are mounted. Wire bonds 140 connect the contact layer on the separation bars 112, 122, 132, etc. to corresponding contact layers on the laser bars 111, 121, 131, etc. The backs of the plates 141, 142, 143, etc. are bonded to a thermally conductive but electrically insulative backing 145 of a thermal cooler 146 by means of solder 144. The cooler 146 may employ water cooling via inlet and outlet conduits 147 and 148 to remove heat from the plates 141, 142, 143, etc.

Figure 11:
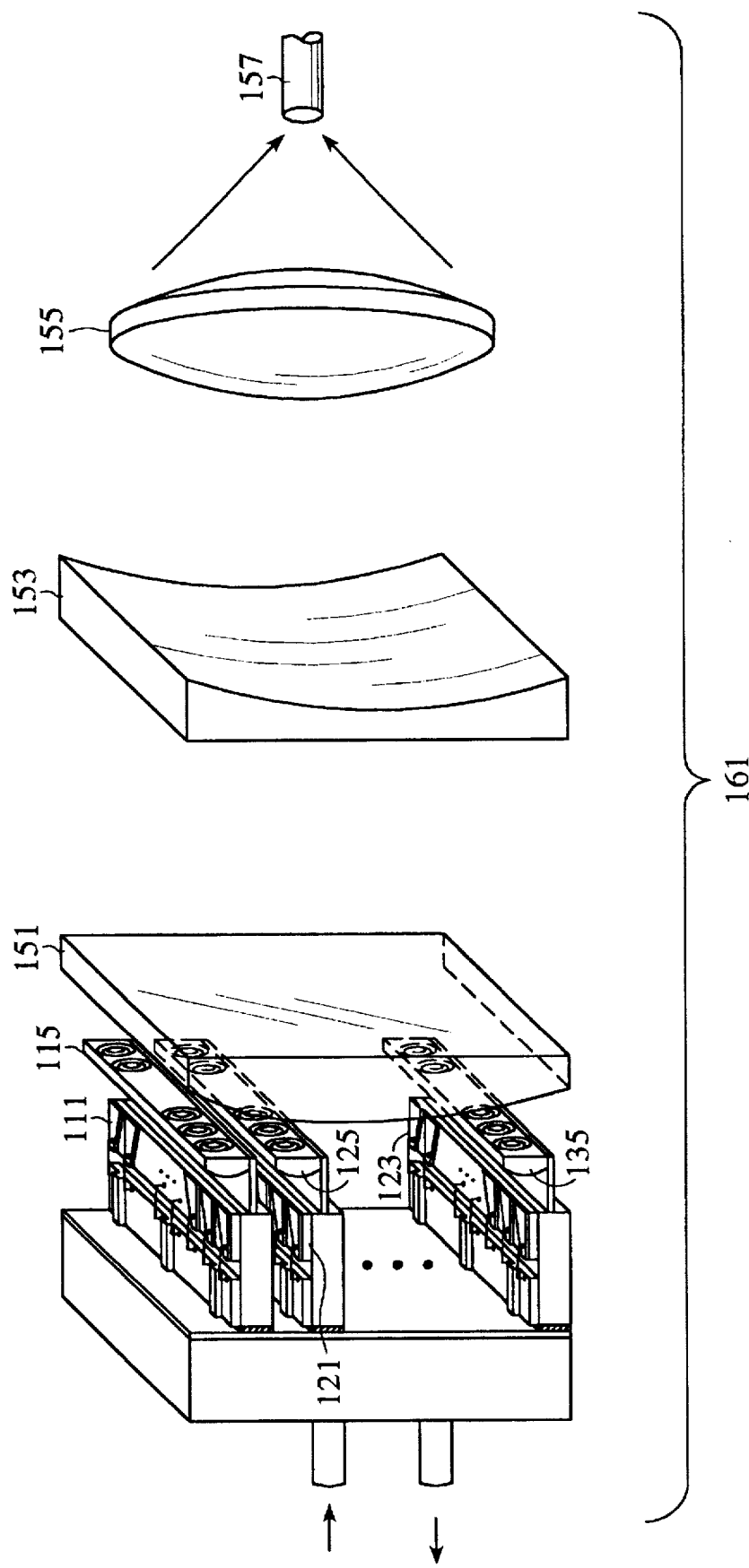
FIG. 11 is a perspective view of the stacked laser system of FIG. 10 coupled by focusing optics to an optical fiber to form a high power laser-fiber unit.

Referring now to FIG. 11, the collimated light output from the stacked lens arrays 115, 125, 135, etc. can be focused to a spot for coupling into an optical fiber 157 by means of one or more focusing lenses 151, 153 and 155. In addition, if the stack of laser bars 111, 121, etc. provides a light with an aspect ratio of other than 1:1, then the focusing lenses may include a set of cylinder lenses 151 and 153 to reduce the longer of the lateral or transverse dimension of the light output by an amount necessary to symmetrize the light (e.g., if the stack is 2 cm high by 1 cm wide for a 2:1 aspect ratio of the light output, then a 2:1 reduction in the transverse direction needs to be provided by the cylinder lenses 151 and 153). The second cylinder lens 153 may be a negative lens to recollimate the light. The main focusing lens 155 typically has radially symmetric surfaces, which may be either spherical or aspherical in cross-section. A group of several lens elements may combine to form this focusing lens.

Figure 12:
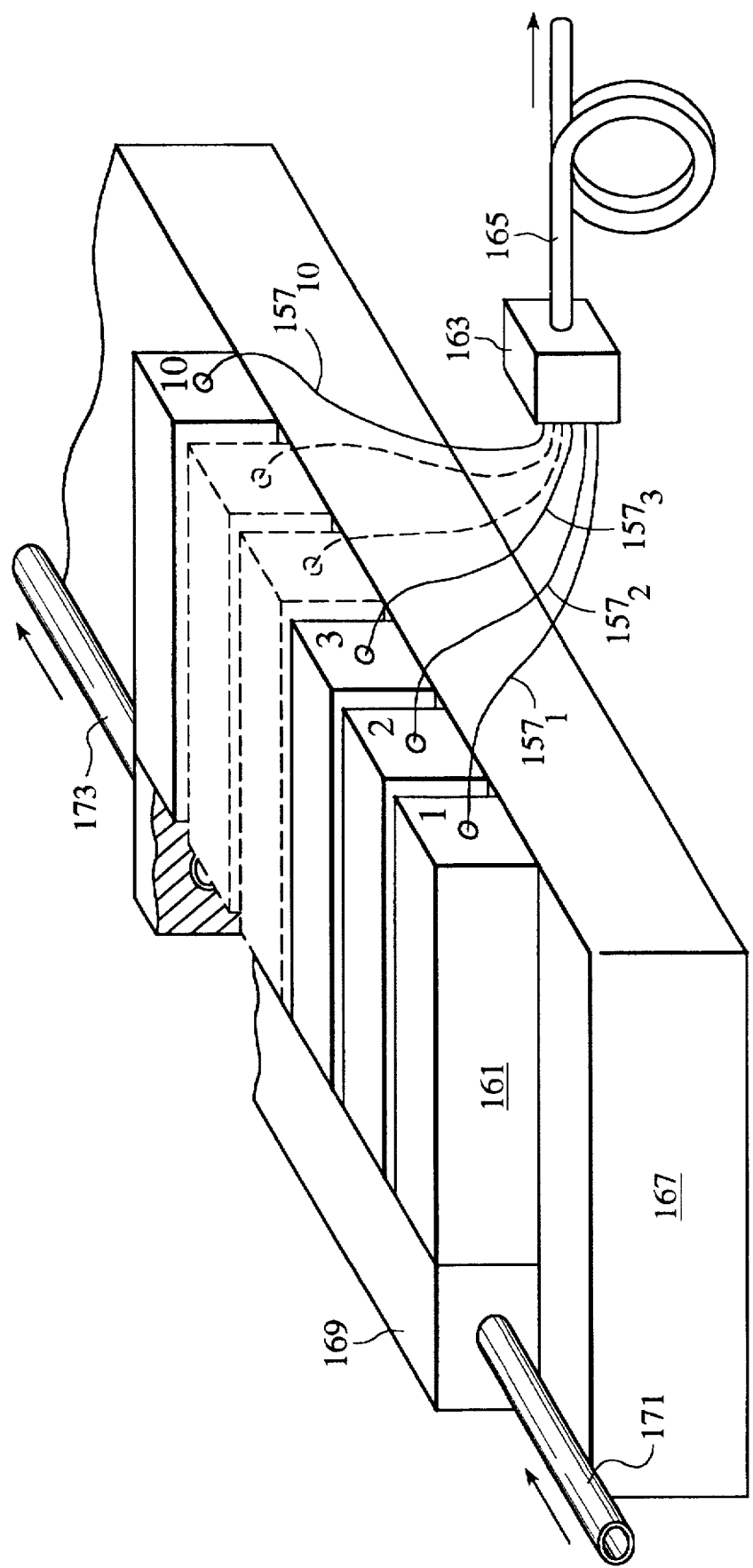
FIG. 12 is a perspective view showing a plurality of high power laser-fiber units of FIG. 11 combined together into a very high power system.

In FIG. 12, the cooler, the stack of plates, laser bars and lens arrays, and the focusing optics coupling the astigmatism-corrected light into an optical fiber 157 form a high brightness laser diode source 161 with a typical output power in the fiber of approximately 100 W. The fiber 157 may be a double-clad fiber. A plurality of such units 161, labelled 1, 2, 3, . . . , to 10 in FIG. 14, can have their output fibers $157_1$, $157_2$, $157_3$, . . . , $157_{10}$ formed into a fiber bundle, or combined in a fiber coupler 163 to provide a single high power (1 kW) fiber output 165. The optical fiber 165 can also be a double-clad fiber. Other methods of beam combining, including free-space beam combining, polarization combining, or both, may also be used. The units 161 may be set upon a base 167 with a single water manifold 169 with inlet 171 and outlet 173 providing the coolant to the water coolers in the respective units. The high power laser output from the fiber 165 is useful for material cutting applications.

We claim:

1. A light source comprising:
   a semiconductor light source for providing a spatially coherent, astigmatic light beam along a light path;
   a single lens positioned in the light path for receiving the beam having
      a first lens surface for receiving the beam having a first curvature that is toroidal with an acircular cross-section and
      a second lens surface for exit of the beam having a second curvature that is aspherical.

2. The light source of claim 1 wherein said semiconductor light source includes an optical cavity having a gain region with a lateral dimension along its length in the optical cavity that is greater than a lateral dimension along other portions of the optical cavity.

3. The light source of claim 1 wherein said semiconductor light source includes a light diverging region along the optical path.

4. The light source of claim 1 wherein said light source is employed in a system for material processing.

5. The light source of claim 4 wherein said processing comprises material cutting, welding or surface treatment with the light beam.

6. A coherent light source comprising:
   a semiconductor optical source generating and emitting at least one high power spatially coherent, but astigmatic, light beam from an emitting surface,
   the semiconductor optical source characterized by having a large lateral gain width region resulting in highly astigmatic light beam wherein the lateral beam dimension of the light beam at the emitting surface is at least ten times larger than its transverse dimension at the emitting surface, a single lens positioned in the path of the light beam emitted from the semiconductor optical source emitting surface, the lens having a first lens surface that is toroidal and a second lens surface that is radially symmetric and aspherical, the first and second lens surfaces having curvatures which in combination are adapted to correct astigmatism in said light beam.

7. The light source of claim 6 wherein said semiconductor optical source comprises a laser diode having a light diverging region therein.

8. The light source of claim 7 wherein said laser diode is a flared-resonator-type laser diode in which said light diverging region is a flared gain region located within a resonant laser cavity of the laser diode.

9. The light source of claim 7 wherein said laser diode is a flared-amplifier-type MOPA device in which said light diverging region is a flared power amplifier region optically coupled to a single-mode laser oscillator.

10. The light source of claim 6 wherein said semiconductor optical source comprises a wide-area laser diode with a DFB grating oriented at an angle to an emitting surface thereof.

11. The light source of claim 6 wherein said semiconductor optical source comprises a diode laser array having a plurality of light diverging regions emitting a plurality of high power, coherent, but astigmatic, light beams therefrom, said single astigmatism-correcting lens comprising a lens array having a plurality of lenslets aligned with corresponding light diverging regions to receive said plurality of light beams.

12. The light source of claim 11 wherein said first lens surface is an array of toroidal lenslet surfaces aligned with said light diverging regions of said diode laser array.

13. The light source of claim 11 wherein said second lens surface is an array of radially symmetric lenslet surfaces aligned with said light diverging regions of said diode laser array.

14. The light source of claim 13 wherein said lenslet surfaces are aspheric surfaces.

15. The light source of claim 6 wherein said first lens surface is positioned where a transverse dimension of light emitted from said semiconductor optical source is substantially equal to a lateral dimension of said light.

16. The light source of claim 6 further comprising an optical fiber optically coupled to the single lens to receive the astigmatism-corrected light beam therefrom.

17. The light source of claim 16 wherein said optical fiber is a double-clad fiber.

18. The coherent light source of claim 6 wherein the lateral dimension is several 100 times larger than the transverse beam dimension at the emitting surface of the source.

19. The coherent light source of claim 18 wherein the apparent reimage location of the lateral dimension is at least about 500 μm within the source from said emitting surface.

20. A coherent light source comprising:

a semiconductor optical source generating and emitting a high power spatially coherent light beam, said source having a light diverging region therein whereby said emitted light beam is astigmatic, a single lens having a toroidal first lens surface and a radially symmetric, aspherical second lens surface, said lens positioned in front of said semiconductor optical source to receive said astigmatic light beam emitted therefrom, said first and second lens surfaces having orthogonal lateral and transverse curvature components which in combination are selected to correct astigmatism of the light beam.

21. The light source of claim 20 wherein said semiconductor optical source is a flared-resonator-type laser diode.

22. The light source of claim 20 wherein said semiconductor optical source is a flared-amplifier-type MOPA.

23. The light source of claim 20 wherein said semiconductor optical source is a flared amplifier chip, both said chip and said astigmatism-correcting lens being located within a resonant laser cavity.

24. The light source of claim 20 wherein said semiconductor optical source is a wide-area laser diode with a DFB grating oriented at an angle to an emitting surface thereof.

25. The light source of claim 20 wherein said first lens surface is positioned where a transverse dimension of said light beam emitted from said semiconductor optical source is substantially equal to a lateral dimension of said light beam.

26. The light source of claim 20 further comprising an optical fiber optically coupled to the single lens to receive the astigmatism-corrected light beam therefrom.

27. The light source of claim 26 wherein said optical fiber is a double-clad fiber.

28. A coherent light source comprising:

a semiconductor optical source generating and emitting an array of high power spatially coherent light beams at an emitting surface, said optical source including a plurality of light diverging regions arranged side-by-side therein, said light diverging regions providing a highly astigmatic light beam wherein the lateral beam dimension of the light beam at the emitting surface is at least ten times larger than its transverse dimension at the emitting surface, a single lens array positioned in front of the semiconductor optical source with lenslets of said lens array aligned with corresponding light beams emitted from said light diverging regions of said optical source, said single lens array having a first lens surface that is toroidal and an array of second lenslet surfaces that are aspherical and radially symmetric and aligned with said light beams, said first lens surface and the array of second lenslet surfaces having curvatures which in combination are selected to correct astigmatism of said light beams.

29. The light source of claim 28 wherein said first lens surface is an array of toroidal lenslet surfaces aligned with said light beams.

30. The light source of claim 28 wherein said second lenslet surfaces are positioned where said light beams have expanded to substantially fill space between said beams.

31. The light source of claim 28 further comprising at least one optical fiber optically coupled to said lens array to receive the astigmatism-corrected light beams therefrom.

32. The light source of claim 31 wherein said at least one optical fiber is a double-clad fiber.

33. A light source comprising:

a semiconductor light source for providing a spatially coherent, astigmatic light beam alone a light path;

a single lens positioned in the light path for receiving the beam having a first lens surface for receiving the beam having a first curvature that is toroidal with an acircular cross-section, the acircular cross-section being hyperbolic-shaped and a second lens surface for exit of the beam having a second curvature that is aspherical.

* * * * *